United States Patent

Zarowin et al.

[11] Patent Number: 5,811,021
[45] Date of Patent: Sep. 22, 1998

[54] PLASMA ASSISTED CHEMICAL TRANSPORT METHOD AND APPARATUS

[75] Inventors: Charles B. Zarowin, Pacific Palisades; Robert Baron, Santa Monica, both of Calif.

[73] Assignee: Hughes Electronics Corporation, El Segundo, Calif.

[21] Appl. No.: 396,407

[22] Filed: Feb. 28, 1995

[51] Int. Cl.[6] .............................. C23C 4/00; C23C 16/54; H01L 21/02; H05H 1/00
[52] U.S. Cl. ...................... 216/67; 118/723 R; 156/345; 427/569
[58] Field of Search .................................... 118/695, 704, 118/705, 706, 722, 723 R, 729, 730, 733, 107, 111; 438/714, 716, 729, 731, 782; 204/298.27, 298.28, 298.36; 134/1.1, 1.2, 180, 181; 216/67, 71; 427/569; 315/111.11, 111.21; 901/17; 156/345

[56] References Cited

U.S. PATENT DOCUMENTS

| | | | |
|---|---|---|---|
| 3,885,245 | 5/1975 | Nakatani | 360/101 |
| 4,647,512 | 3/1987 | Venkataramanan | 428/688 |
| 4,668,366 | 5/1987 | Zarowin | 156/345 |
| 4,714,536 | 12/1987 | Freeman et al. | 156/345 |
| 5,292,400 | 3/1994 | Mumola | 156/345 |
| 5,312,510 | 5/1994 | Poultney | 156/345 |
| 5,336,335 | 8/1994 | Zarowin et al. | 156/345 |
| 5,382,311 | 1/1995 | Ishikawa et al. | 156/345 |

OTHER PUBLICATIONS

C.B. Zarowin, "Basis of Macroscopic and Microscopic Surface Shaping and Smoothing by Plasma Assisted Chemical Etching," J. Vac. Sci. Technol. B 12(6), Nov./Dec. 1994, pp. 3356–3362.

C.B. Zarowin, "Robust, Noniterative, and Computationally Efficient Modification of van Cittert Deconvolution Optical Figuring", J. Opt. Soc. Am. A, pp. 2571–2583 (1994).

*Primary Examiner*—Jeffrey E. Russel
*Attorney, Agent, or Firm*—V. D. Duraiswamy; W. K. Denson-Low

[57] ABSTRACT

A plasma assisted chemical transport system for additive or subtractive shaping of a substrate surface employs a plasma head (30) that generates a plasma (34) and is caused to scan the surface of a workpiece (51) to provide selective shaping, either by etching or depositing material. Corrosive gases of the plasma are isolated to minimize corrosive effects on the drive mechanism (20) by encompassing the plasma head within a flexible bellows (64). Scanning is in a circular path of varying radius. Acceleration induced vibrations caused by programmed varying scan velocity are avoided by use of an oppositely rotation body (56) of equal torsional inertia. Effects of linear acceleration in the radial direction are effectively avoided by making rotational scan velocity many times greater than radial scan velocity. Errors due to singularity that could exist when the scanning plasma head is at the center of its scan are kept within acceptable tolerances by stopping the scan when the center of the scanning head (30) is at a distance Δr from the center of the scan path that is equal to incremental radial steps between successive circular scan paths.

38 Claims, 4 Drawing Sheets

PLASMA ASSISTED CHEMICAL TRANSPORT METHOD AND APPARATUS

BACKGROUND OF THE INVENTION

1. Field of the Invention

The present invention is directed to improvements in plasma assisted chemical transport and to improved scanning methods and apparatus or to methods in general in which a tool head is scanned over a workpiece.

2. Description of Related Art

Plasma assisted chemical transport, including plasma assisted chemical etching (PACE) and plasma assisted chemical deposition, has been employed for controlling configuration of many different types of surfaces, including semiconductors, metals and insulators. My prior U.S. Pat. No. 4,647,512, for Diamond-Like Carbon Films and Process for Production Thereof, describes the use of one such system for depositing an improved carbon film upon a surface.

My U.S. Pat. No. 4,668,366, for Optical Figuring by Plasma Assisted Chemical Transport and Etching Apparatus Therefor, shows a subtractive vapor transport process in which the surface of a workpiece is etched by means of a plasma induced surface reaction that is caused to selectively move about the surface of a workpiece. In this system the position of a relatively small area plasma cloud that produces the desired etching is moved over the surface of a workpiece. Selective surface shaping can be accomplished by varying the plasma cloud velocity with respect to the surface to vary the amount of time (dwell time) that the small area plasma generating head spends at each of the regions shaped by the workpiece.

Prior plasma assisted chemical transport systems, such as that shown in my U.S. Pat. No. 4,668,366 have caused the smaller area plasma cloud to scan over the surface of the larger area workpiece in a conventional X-Y scan, employing both X and Y linear drive mechanisms to accomplish the complete scan in X and Y over the surface of the workpiece. In such systems the mechanical drive structures have a seriously shortened life span due to the corrosive effects of the gases in the plasma chamber, some of which contact the drive elements themselves.

Another problem with X-Y scanning drives for such plasma assisted chemical transport is a result of the rectangular scan configuration which does not match the configuration of many different types of substrates, such as silicon wafers for integrated circuit manufacture and optical mirrors. Many such substrates have circular geometries or may be elliptical. Therefore, the rectangular scan configuration of the typical X-Y scanning system will cause motion of the scanning head to areas beyond the circular area of the workpiece, resulting in inefficient and slower operation. The inherent requirement of reversal of direction of motion of the scanning head at each end of each scan line greatly slows the speed of the scan and subjects the scanning mechanism to high accelerations which not only require stronger more complex mechanical structures but also introduces undesirable and often unacceptable vibration. Even beyond the inherent requirement of scan direction reversal of the X-Y scan system is the requirement in many applications of changing scan velocity during the course of a single scan so as to vary dwell time, and, therefore, to vary the amount of material added or removed at different portions of the workpiece. These changes in velocity also induce unwanted vibrations. It is difficult, if not impossible, to balance out or to eliminate vibration introduced by the linear accelerations of a variable velocity X-Y scanning head. Therefore it has been the practice in the prior art to decrease velocities so that the required variation in dwell time and the required reversal of direction at the end of each scan line do not introduce unacceptable vibration. Accordingly, the price of elimination of vibration is greatly reduced speed of system operation.

SUMMARY OF THE INVENTION

In carrying out principles of the present invention in accordance with a preferred embodiment thereof, many of the above-mentioned problems of prior art systems are minimized or avoided. Adverse effects of contact between the plasma gas and the drive mechanism are effectively eliminated by a flexible environmental separator connected between the plasma reaction chamber housing and the movable tool within the housing, with the separator being configured and arranged to block passage of corrosive fluid from the chamber to the drive mechanism.

For minimizing acceleration induced vibration, the plasma tool is caused to scan in a substantially circular path, with the scan path being shifted radially of the scan center to obtain a full scan over the area of the workpiece. Linear radial velocity of the tool head is much smaller than its rotational velocity so that acceleration induced vibration is generated only by the rotational accelerations which can be balanced out by a counter rotating torsional mass. In one scan program the scan and the operation of the working head are stopped when the center of the working head is at a finite distance from the scan center point. By not allowing the center of the scan head to reach the scan center point, although the tool head footprint does overlap the scan center point, the error in etch or deposit depth at very small radii is kept to an acceptable tolerance. Using sufficiently small radial scan steps and stopping the scan when the tool center is spaced from the scan path center by the distance of the scan steps enables the etch or deposit depth error at the scan center to be held within acceptable tolerances.

DESCRIPTION OF PREFERRED EMBODIMENTS

Figure 1:
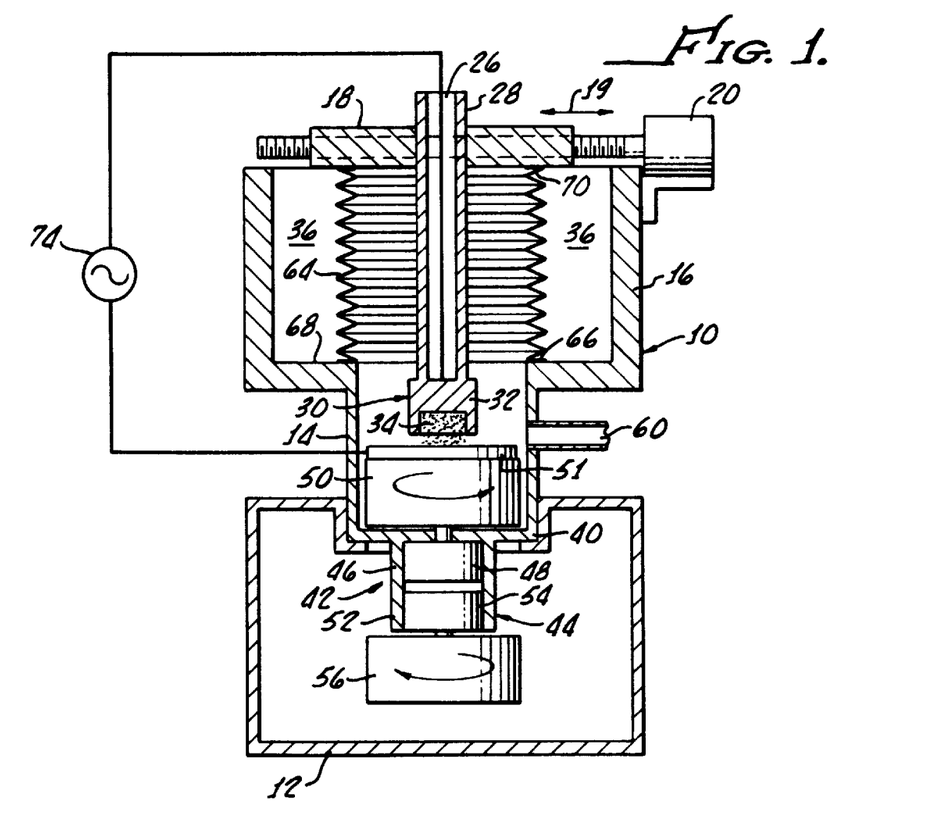
FIG. 1 is a cross section, taken on lines 1—1 of FIG. 2, of a plasma assisted chemical transport apparatus embodying principles of a rotary scan of the present invention.

FIG. 1 illustrates significant portions of a plasma assisted chemical transport apparatus incorporating a scanning plasma tool head. In some general aspects, the apparatus of FIG. 1 is similar to the etching apparatus shown in my earlier U.S. Pat. No. 4,668,366, but differs therefrom by a number of significant features. The apparatus of FIGS. 1 and 2 employs a relatively smaller plasma tool head that scans over a relatively larger rotating substrate and concomitantly moves radially between an outermost perimeter of the substrate and the substrate center. The rotary substrate motion, and more specifically its rotary vibrations, are counterbalanced by a counter-rotating torsional body. Linear radial vibration is negligible because radial velocity is very much smaller than rotational velocity. Plasma generated by the plasma tool head is isolated from the linear drive mechanism, which drives the plasma tool head radially of the rotating substrate, by means of a flexible surrounding curtain.

A fixed housing 10 that is fixedly mounted on a lower support or floor 12 includes a lower portion 14 of lesser diameter and an upper portion 16 of greater diameter. To the top of portion 16 is slidably mounted a platform 18 that is driven either unidirectionally or bi-directionally in the direction of arrow 19 at a radial velocity r by a screw drive and motors 20 carried by to the housing 10. Platform 18 is mounted on the upper end of larger portion 16 a housing 10 on slidable guideways that allow the platform 18 to be linearly driven by the motor in a horizontal direction, as viewed in FIG. 1, lying in the plane of the paper, for a limited distance in either direction. Platform 18 includes an aperture through which extends a gas input conduit 26 that is in sealed communication with a rigid hollow plasma head support stem 28 that is fixed to and depends from the lower side of the sliding platform 18. Fixed to the lower end of support stem 28 is a plasma tool head 30, having a downwardly facing and downwardly opening cup-shaped area 32 that is arranged to produce a plasma cloud 34. Plasma head 30 is made of an electrically conductive porous material, such as an electrically conductive porous carbon, magnesium, or stainless steel, which is arranged so as to flow gas introduced into the hollow support stem 28 through the plasma head to the interior of the plasma chamber 36 within the housing 10.

Fixedly mounted to a bottom wall 40 of the lower portion 14 of housing 10 are a pair of coaxial motors 42,44. Motor 42 includes a housing 46 fixed to the housing 10 which comprises portion 14 and a rotor 48 having a shaft that extends upwardly through the bottom wall of portion 14 housing 10 for connection to and support of a rotary chuck 50.

Motor 44 includes a motor housing 52 fixed to and carried by motor housing 46, and also includes a rotor 54 that is coaxial with, but not connected to, rotor 48 of motor 42. A counterbalancing mass 56 is connected to and supported by the rotor 54 of the second motor. Mass 56 is arranged to provide a torsional inertia to counter the torsional inertia of the mass of the chuck 50.

Motors 42 and 44 are driven with the same electrical driving signals, but in opposite directions. The arrangement is such that the torsional mass that rotates in one direction, being driven by motor 42, is equal to the torsional mass that is driven in the opposite direction by the second motor 44. Thus the rotor 48 and chuck 50, together with a substrate 51 thereon, have a torsional mass that is equal to the torsional mass of the rotor 54 and counterbalance body 56. The rotational velocities of the two torsional masses are equal and opposite and therefore the momentum of one is equal and opposite to the momentum of the other. Accordingly, as the rotational velocity of motor 42 is changed to control circular scan velocity, a reactive torque is generated which is precisely cancelled by the equal but opposite acceleration of motor 44 and its counterbalancing mass.

Chamber 36 includes an exit conduit 60 from which gas within the chamber is withdrawn by a vacuum pump (not shown). By means of this pump, the pressure within the vacuum chamber 36 is reduced to a suitable operational value of between 1 and 10 Torr, for example.

A continuous substantially cylindrical bellows 64 has a lower end 66 fixed and sealed to a shoulder 68 of plasma housing 10 and an upper end 70 fixed and sealed to the lower side of the linearly shiftable platform 18. Accordingly, as the platform 10 shifts relative to the housing 16 (see FIG. 3), the upper portion of the bellows moves relative to its lower portion and the bellows flexes. Despite position of and motion of the bellows and platform 18, the chamber 36 is sealed by the bellows between the platform so that the chuck 50 with its substrate 51 is effectively sealed against escape of any significant amount of corrosive gaseous plasma. Thus, the platform linear drive mechanism is sealed against corrosive effects of the plasma gas within the chamber.

Bellows 64 is preferably formed of a strong but thin and flexible stainless steel with a number of strengthening horizontal corrugations that give the bellows sufficient strength to withstand the pressure differential to which it is subjected by the relatively low pressure (in the order of about 10 Torr or less) inside the bellows, and the atmospheric pressure (about 760 Torr) within the housing externally of the bellows.

A source 74 of radio frequency energy, providing a power density for example of about 10 watts per cubic centimeter and an excitation frequency of about 13.56 megahertz, applies an RF field between the plasma chuck 30 and conductive substrate 51.

To protect the rotary drive mechanism, including the shafts and rotors of motors 42 and 44, the motor shafts (or at least the motor shaft of motor 42) has its bearings sealed by a fluidics bearing sleeve (not shown) made by Ferro Fluidics Corporation of Nashua, N.H.

If deemed necessary or desirable, the plasma head 30, together with its supporting stem 28, may be made vertically adjustable by a conventional arrangement (not shown) so that the head may be lifted for insertion and removal of a workpiece to the surface of the chuck. Such vertical adjustment may also be used to extend, if necessary, the total depth of etch or total height of deposit relative to the initial surface of the workpiece. For example, if the total depth of etch is beyond the range of the plasma head at a nominal vertical position, the material is first etched to a depth within the range of the plasma head etching, and thereafter the plasma head is lowered to provide a further depth of etching.

Various well known methods may be employed for securing the workpiece or substrate of which the surface is to be configured to the rotating chuck. These methods include vacuum and electrostatic attachment. The latter is presently preferred. A suitable door or sealable opening (not shown) may be provided in the decreased diameter portion 14 of the housing 10 opposite discharge conduit 60, for example, for ease of insertion and withdrawal of a substrate that has been attached to or is to be attached to the rotating chuck.

Further details of the circular scanning, including an explanation of effective cancellation of acceleration induced vibration and a practical solution for avoiding a singularity that can occur if the plasma head is precisely at the scan center, are set forth below in connection with the description of FIGS. 9–12.

Theory and operation of the process of plasma assisted chemical vapor transport are well known. They are described in the above-identified patents and in a paper entitled "The Basis of Macroscopic and Microscopic Surface Shaping and Smoothing by Plasma Assisted Chemical Etching (PACE)" by C. B. Zarowin published in the Journal of Vacuum Science Technology, December 1994. Briefly, in one specific example, for the subtractive or etching process, a solid, such as a silicon substrate (the workpiece), reacts with a gas such as chlorine introduced into and through the plasma head. The process is subtractive when a solid S (silicon) reacts with a gas A (chlorine) to form a volatile compound B (silicon tetrachloride) on the surface of the solid, or, conversely, is additive when this compound B decomposes on the surface into a solid S and a reactant gas A. For example, solid silicon reacts with chlorine gas to form silicon tetrachloride, which is removed by the vacuum pump in an etching process. Conversely, silicon tetrachloride gas, introduced into the reaction chamber, decomposes into its constituents silicon and chlorine in an additive process. In simplest form the volatile compound B is pumped out of the reactor chamber to perform etching and into the chamber for deposition, with the compound being driven by flow. In general, it is driven by flow and/or surface chemical potential differences. In contrast to surface temperatures of 300° to 1000° C. required by thermally driven chemical vapor transport systems, plasma assisted chemical vapor transport permits the reaction to occur near room temperature because the plasma enhances the reaction by providing energy at the surface. The applied radio frequency energy from source 74 excites the plasma species providing kinetic energy to charge species (ions and electrons) and/or potential energy to uncharged species (radicals), thereby assisting or enhancing surface chemical reaction rates at lower temperatures on the reaction surface.

The parameters of the reaction are controlled so that a constant etch rate or deposition rate is achieved. The system is operated to provide both macroscopic shaping (or figuring) of a surface in order to obtain a desired surface configuration and also provides microscopic pattern transfer and micro-smoothing (or polishing). Macroscopic surface figuring or shaping is based upon obtaining a reliably constant etch rate map of the scanning plasma head. Programmed scanning by the etch profile of the plasma head over the surface to be shaped then allows arbitrary aspheric shaping on this surface.

For surface shaping of a workpiece the Z axis or vertical removal shape of the workpiece removal volume acted on by the plasma etch tool in a fixed position is first determined experimentally for a given set of plasma parameters. For example, such a material removal cross section is shown, inverted, in FIG. 10 for a plasma assisted chemical etching tool. Then the initial unworked workpiece surface shape in Z axis (vertical, or in the direction of the axis of the plasma head support stem 28) is determined by scanning the unworked workpiece surface either mechanically, optically or electrically, and a Z axis map of surface configuration is recorded. Such scanning and mapping techniques, including optical interferometry, are well known.

For a given final surface configuration of the workpiece and for a given scan pattern with the known plasma tool removal rate, desired plasma head dwell time (dwell time is inversely proportion to scan velocity) at points in the scan are calculated and scan velocity is programmed over the entirety of the scan by deconvolution techniques employing Fourier transforms. Development of such dwell time (velocity) programming is described in an article by C. B. Zarowin entitled "Robust Noniterative and Computationally Efficient Modification of Van Cittert Deconvolution" published in the Journal of the Optical Society of America, A 11(10), October 1994, pages 2571–2583.

Figure 5:
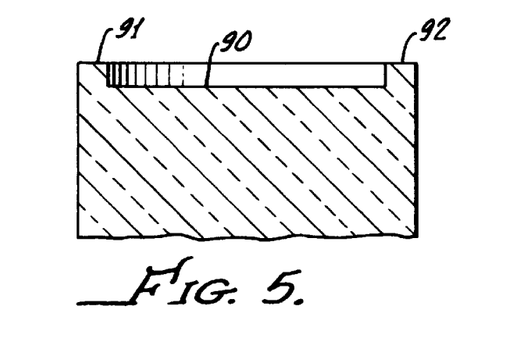
FIGS. 5, 6 and 7 are illustrative cross sections of exemplary shapes of surfaces etched by the tool of FIGS. 1 and 4.
Figure 6:
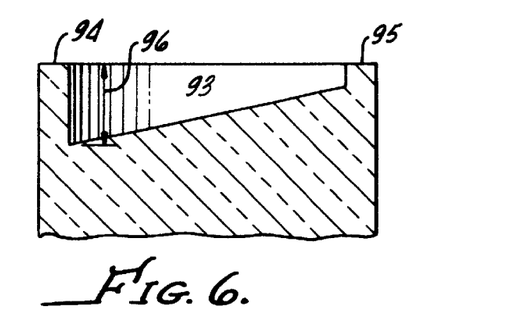
Figure 7:
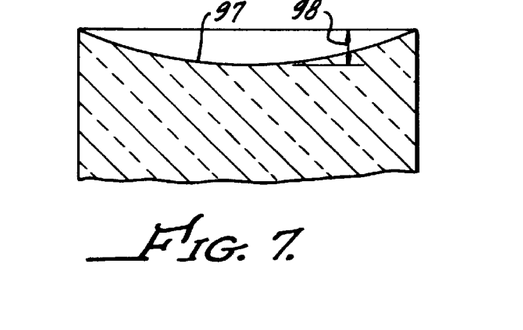

FIGS. 5, 6 and 7 show just a few illustrative shapes that may be obtained with the described plasma assisted chemical transport apparatus and method.

FIG. 5 shows an optical flat having a surface 90 positioned between regions 91 and 92 that were masked during the plasma assisted etching.

FIG. 6 illustrates a wedge shape formed by a surface 93 between masked regions 94 and 95 wherein the greatest depth of the etched region, as indicated at 96, is about 2½ microns.

FIG. 7 illustrates a parabolic surface 97 formed by a programmed variable velocity (variable dwell time) plasma assisted chemical etching scan in which the maximum depth of the final parabolic surface is indicated at 98 is 5 microns.

Figure 2:
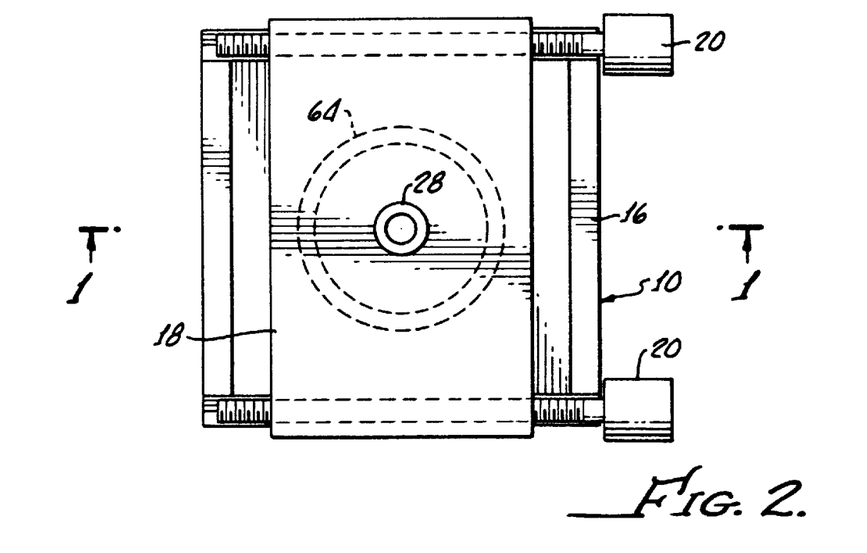
FIG. 2 is a top view of the apparatus of FIG. 1.
Figure 3:
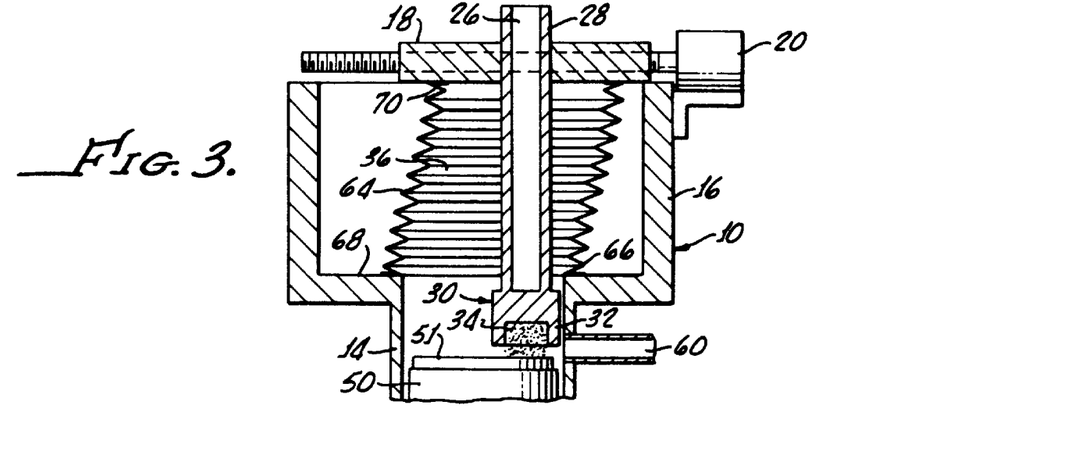
FIG. 3 illustrates the apparatus of FIG. 1 with the plasma chuck in a displaced position.

FIGS. 1, 2 and 3 illustrate the use of an environmental protective curtain in the form of bellows 64 employed in a reaction chamber that utilizes a rotary scan. Principles of the arrangements of FIGS. 1 through 3 may also be applied to protection of drive mechanisms of an X-Y scanning device in the manner illustrated in FIG. 4 and 4a. In the simplified showing of an X-Y scanning apparatus in FIGS. 4 and 4a, there is provided a solid fixed base 100 having upwardly facing guideways 102,104 which are parallel to each other and extend in a Y direction as indicated by the doubled headed arrow labeled Y. Slidably mounted on the guideways 102,104 for motion in the Y direction is an intermediate housing 106 which is driven bi-directionally along the Y axis by a pair of motors of which one, indicated at 108, is shown. The motors, which are fixedly mounted to the base 100, drive screw drives, such as screws 110, to shift the intermediate housing 106 along the base. Intermediate housing 106 has side walls carrying mutually spaced parallel guideways 114,116 that extend in an X direction, as indicted by the arrow X (perpendicular to Y), and slidably support a platform 120 on the guideways 114,116. Platform 120 is driven by motors 121 and 122, fixedly carried by the intermediate platform 106, and driving screws 124,126 to drive the platform 120 bi-directionally in the X direction. Both the base and the intermediate platform or housing 106 are sealed, with the lower wall 130 of intermediate housing 106 having an internal aperture 131 (FIG. 4a) that receives a chuck 132 fixedly carried by base 100 and upstanding therefrom to project to the aperture 131. The X motion platform 120 fixedly carries a depending plasma head support stem 140, to the lower end of which is fixed a plasma head 143 that may be the same as plasma head 30 of FIGS. 1–3. The plasma head is carried in close proximity to a substrate 142 that is detachably secured to the fixed chuck 132. The plasma head 143 is thus driven in the X direction by motion of platform 120 and in the Y direction by motion of the intermediate housing 106, together with the platform 120, to accomplish an X-Y scan of the plasma head over the surface of the substrate.

Figure 4:
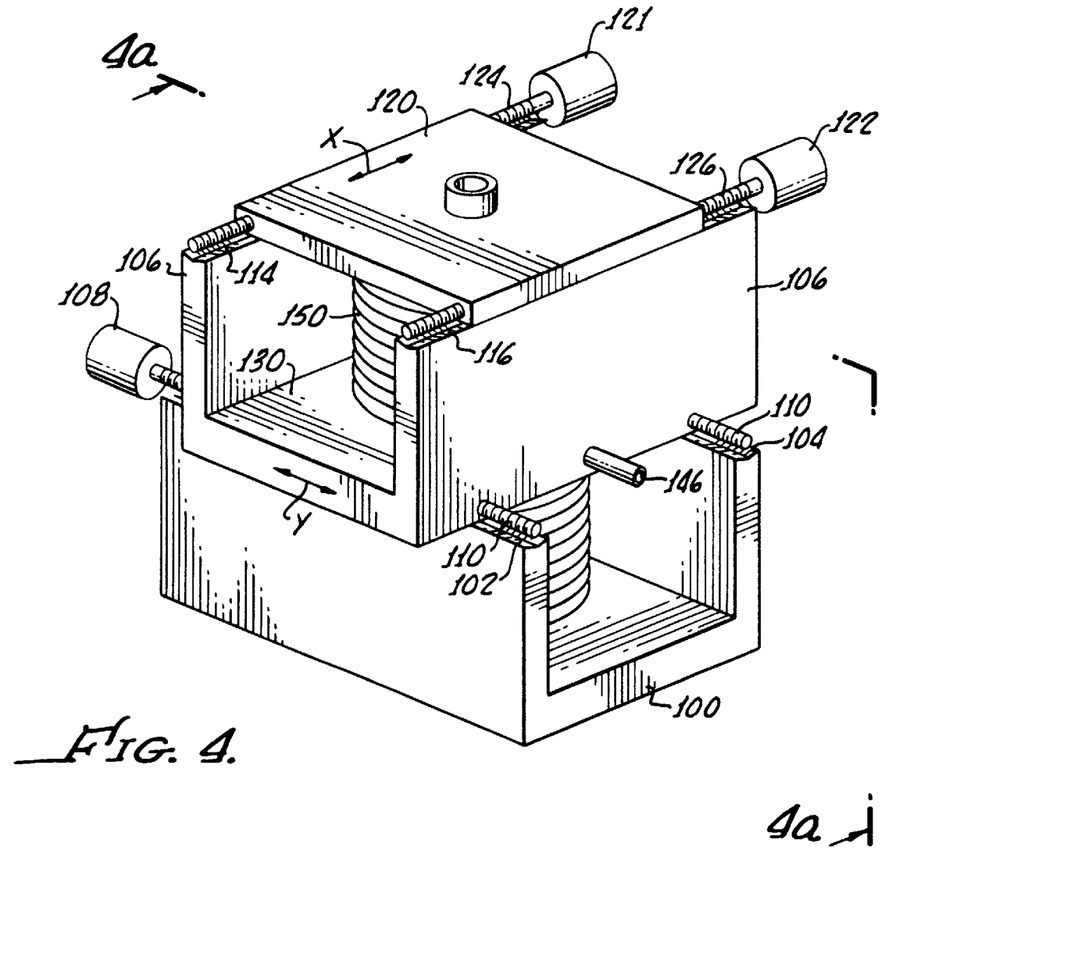
FIG. 4 is a pictorial view of a plasma assisted chemical transport apparatus embodying an X-Y scan with a corrosive gas protected scan mechanism.
Figure 4A:
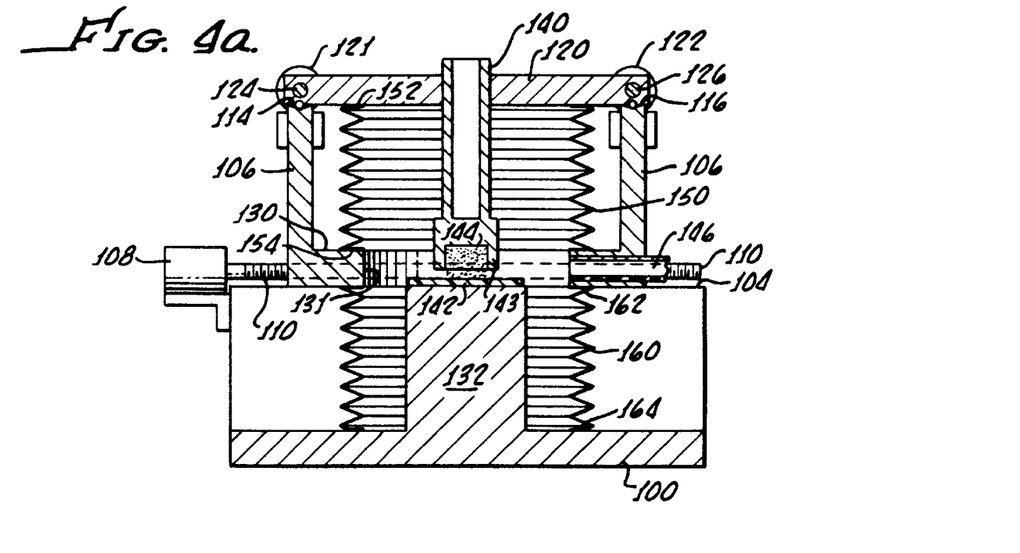
FIG. 4a is a section taken on lines 4a—4a of FIG. 4.

A suitable gas is introduced through the hollow support stem 140 to and through the plasma head to provide a plasma cloud in the area 144 between the plasma head and the workpiece. This gas within the chamber is withdrawn by a negative pressure pump (not shown) applied to a conduit 146 that extends from the interior of the plasma chamber to the exterior of the apparatus.

In order to protect the drive mechanisms, such as the screw drives and motors, from the corrosive effects of the reaction of the gases within the plasma chamber, a first environmental curtain in the form of a substantially cylindrical, flexible, stainless steel bellows 150, is positioned to completely encircle the support stem 140 and plasma head 143 and has its upper and lower ends fixed and sealed at areas 152 and 154 to the upper or X platform 120 and to the bottom of the intermediate Y housing 130, respectively, thereby providing an isolating barrier between the X drive mechanisms and the plasma cloud 144.

To protect the Y drive mechanisms that drive the intermediate housing 106, a second environmental curtain in the form of a flexible stainless steel bellows 160 completely circumscribes the chuck 132 and substrate 142 and is fixedly connected and sealed at upper and lower ends portions 162,164 to the lower side of the bottom of the intermediate Y housing 106 and to the bottom wall or floor of the fixed base 100. Thus, as the platform 120 moves in the X direction bellows 150 will flex in this direction but maintain the seal around the plasma chamber. Similarly, as the intermediate housing 106 moves in the Y direction, bellows 160 will flex in the Y direction to maintain the seal around the lower portion of the plasma chamber to protect the Y axis drive. Each bellows may be the same as bellows 64 of FIG. 1.

A suitable radio frequency excitation (not shown in FIG. 4) is applied between the chuck 132 and the plasma head via the stem 140 in the same manner and for the same purpose as described in connection with the apparatus of FIGS. 1 through 3. The X-Y apparatus of FIG. 4 operates in the same manner as does the apparatus of FIGS. 1 through 3 to provide both microscopic shaping or smoothing and macroscopic shaping according to a program of scan velocities. The two different configurations, that of FIGS. 1–3 and that of FIG. 4, illustrate the fact that the disclosed protective curtain is applicable to apparatus that provides either rotary or X-Y scanning. However, the rotary scanning configuration illustrated in FIGS. 1 through 3 has a number of advantages unique to the rotary scan which are not found in the X-Y arrangement. By appropriately controlling the scanning in the rotary configuration, it is possible to eliminate or minimize acceleration induced vibrations and also to avoid an unacceptable etching or deposit anomaly that would occur when the center of the scan head reaches the center of the circular scan pattern. Because of its ability to minimize vibration, the rotary scan apparatus enables much higher production speeds.

Figure 8:
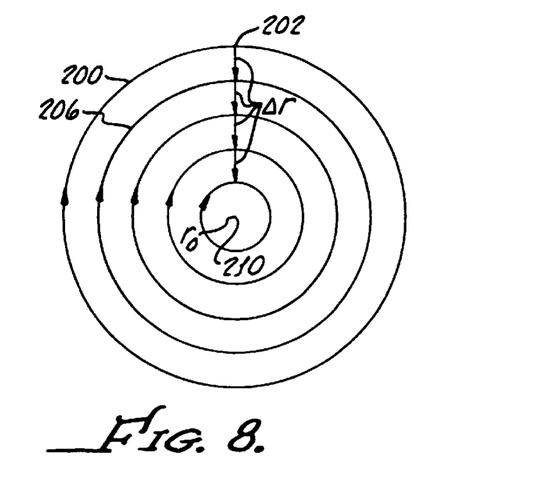
FIG. 8 schematically depicts a substantially circular scan of the tool of FIG. 1.

An example of one circular scan pattern for the apparatus of FIGS. 1–3 is illustrated in FIG. 8, which shows paths of the center of the area of the plasma working head in the course of several consecutive scans of successively decreasing radius. Thus the tool head's center is initially caused to scan in a circular path 200, around a scan center 210, through a full 360°, starting from a point 202, for example, and continuing until the working head center has returned to the point 202, at which time the center of the working head is moved radially through a distance Δr to a second scan path 206. The tool head then completes another 360° scan and again steps inwardly through a small radial distance Δr. This scan procedure, circularly scanning and stepping inwardly radially, continues until the center of the working head is at a finite distance from the center 210 of the scan pattern. All scan paths are concentric and all are centered on scan center point 210. Further details and bases for selection of certain rotary scan parameters will now be described in connection with FIGS. 9 through 12.

A significant feature of the apparatus of FIGS. 1–3 is the fact that the plasma tool head is caused to scan relative to the workpiece in a circular or substantially circular scan pattern. The circular scan is much more efficient when applied to substrates of circular geometries. Many substrates with which plasma assisted chemical transport is used are circular, e.g., wafers for manufacture of integrated circuit chips, and optical instrument mirrors. A common X-Y scan has significant problems in addition to the lack of fit between the rectangular scan and circular substrate geometry. The apparatus shown in FIGS. 1 through 3 avoids the common X-Y raster type scan of the prior art and also avoids the many disadvantages of such an X-Y scan. One obvious problem of the X-Y scan is the required reversal of scan direction at the end of each X-Y scan line. The X-Y scan also is subject to acceleration induced vibration when scan velocity in either X or Y is non-uniform. In many situations, such as, for example, when the depth of etch or deposition is to be varied from point to point on the surface of the workpiece, the tool head angular velocity must be changed so as to change the effective dwell time of the tool head.

The problem of acceleration induced vibration arises as follows:

With proper control of electrical, chemical, pressure and temperature parameters, the etch or deposition rate of the plasma assisted chemical transport tool is constant. When moving in a straight line at a constant velocity, a constant depth of etch or a constant deposition results. However, to change the depth of etch or deposition, the dwell time (the time during which the tool head is at any given area of the workpiece) must be varied. This is accomplished by varying tool velocity. Velocity variation introduces tool head acceleration. This acceleration gives rise to undesired vibration and consequent degradation of accuracy and other aspects of the process. It is difficult, if not impossible, to compensate for such acceleration induced vibration in an X-Y scanning mechanism. Accordingly, the effects of acceleration induced vibration on prior X-Y scanning machines which scan with varying velocity have been reduced (but not eliminated) simply by decreasing the scan velocity, and, accordingly, decreasing the magnitude of the required acceleration. Therefore the entire process is slowed to avoid vibration and also is unduly constrained by such velocity restraint.

In the system illustrated in FIGS. 1 through 3 and described above, the use of a circular or substantially circular scan allows velocities much greater than possible in an X-Y scan system, and yet these velocities can be varied to vary the dwell time during different portions of the scan without introducing unacceptable vibration. This is accomplished in the apparatus described above by providing a counter-rotating mass that introduces equal and opposite accelerations and vibrations, thereby canceling the undesired rotary vibrations. Radial velocity is kept very small so as to effectively eliminate linear radial acceleration.

The preferred scan may be termed a rho-theta (r-θ) scan in which θ is the angular position, about the scan center, of the center of the plasma tool head, and r is the radial distance between the scan center and the tool head center. Effectively vibration free scanning is achieved by making the scan radial velocity, ṙ, much smaller than the scan angular velocity θ̇, and, in addition, providing the counter balancing, oppositely rotating mass. All programmed dwell time variation is provided only by variation of angular velocity.

Circularly scanning tool heads have not been widely employed in the past and have not been employed for any type of plasma assisted chemical transport at least in part because of the problem of dealing with portions of the scan near and at the center of the circular scan. It has been commonly thought that scanning in a rho-theta circular pattern to cover a complete circular area involves a singularity at the center of the scan where scan radius equals zero. Other difficulties at points close to the scan center also occur. It has been thought that an insurmountable obstacle to use of a circular scan is the fact that a circular scan produces increasingly greater distortions as the scan path gets closer to the scan center. It has been believed that the singularity at the scan center prohibits effective dwell control at or near the scan center, and, moreover, makes it difficult to control dwell as the scan path approaches the scan center. This problem may be explained in connection with FIGS. 9 and 10.

Figures 9, 10:
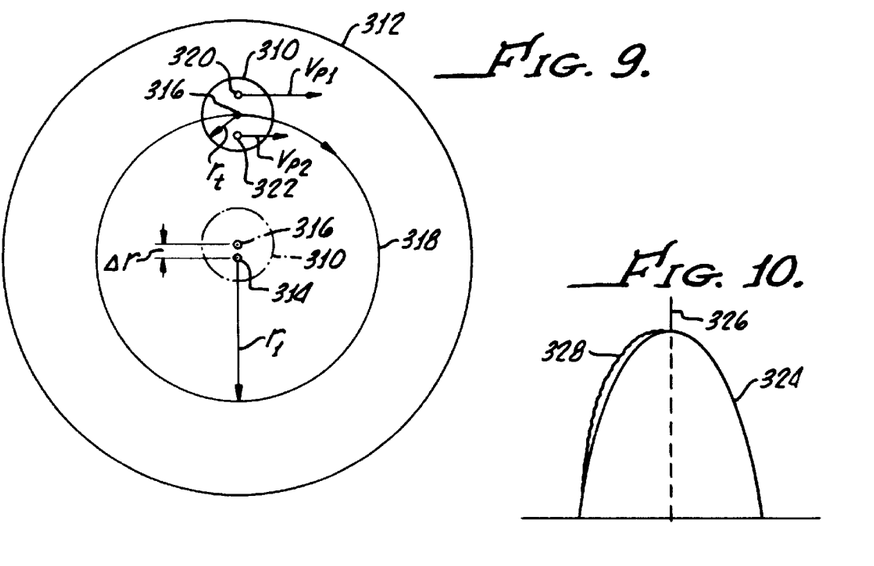
FIG. 9 illustrates certain geometry of tool head rotation and the circular scanning.
FIG. 10 is a cross section, inverted, of the shape of an etched portion of a workpiece, as etched by a plasma assisted chemical etching tool.

FIG. 9 illustrates an exemplary circular footprint 310 of a plasma assisted chemical transport tool head of the type described in FIGS. 1 through 3. This tool head is employed to shape a workpiece, indicated by the circular line 312, by moving the tool head in a rho-theta scan composed of a series of concentric circular scan paths about a scan center 314. The plasma tool head is shown to be positioned with its center 316 at a radius $r_1$ from the scan center 314. In this circular scan the tool footprint is caused to move, as described in connection with FIG. 8, in a complete circle, through 360°, with the tool center 316 initially at a maximum radius. Thereafter the tool footprint is moved inwardly radially by a scan step amount, which may be termed $\Delta r$, and another full 360° scan is accomplished. This circular scan and radial inward step is repeated until the tool center 316 is very close to, but spaced from, the scan center 314. Thus the overall scan of the tool footprint is through a number of concentric circular scan paths, with each successive path overlapping one or more prior paths, and with this inward radial stepping of each scan path continuing until completion of a final scan path, which has a radius equal to the magnitude of the scan step $\Delta r$ between successive scans. In other words, when the center of the tool footprint is at a distance $\Delta r$ (the magnitude of the scan step) from the scan path center 314, the scanning action (and etching or depositing) is stopped. It will be shown below just how this arrangement avoids problems caused by the singularity that occurs at the scan path center.

A significant aspect of this circular scan (rho-theta) involves choice of scan parameters that effectively enable all acceleration induced vibrations to be precisely countered by a counter-rotating mass. This is accomplished by choosing a velocity of the radial component of the scan ($\dot{r}$) that is many times smaller than the linear or tangential velocity $r\dot{\theta}$. considering the tool footprint to move through its circular scan path with a rotational velocity $\dot{\theta}$, the scan stepping or radial scanning is caused to occur in sufficiently small increments, each having a magnitude $\Delta r$, so that the tangential velocity and tangential acceleration are very high compared to radial velocity and radial acceleration. In other words, the scan parameters are chosen such that radial scan velocity $\dot{r}$ is much less than the product $r\dot{\theta}$, and $\ddot{r}$ is much less than $r\ddot{\theta}+(2\dot{r}\dot{\theta})\div r$. Moreover, all dwell time variations are programmed into the rotational velocity program. No dwell time variations are handled by radial velocity changes.

Because radial velocity and radial acceleration are so small compared to tangential velocity and tangential acceleration, vibrations induced by radial acceleration are negligible. Only tangential acceleration induced vibration has any affect on the apparatus. Since these tangential acceleration induced vibrations are substantially completely balanced out by the counter-rotating mass described above, the effect of accelerations caused by varying dwell times and velocities are effectively eliminated.

The problems arising in a circular scan (rho-theta) that relate to the scanning positions at or near the scan center may be explained in connection with FIGS. 9 through 12. As indicated in FIG. 9, the scan footprint 310 has a circular configuration for purposes of this discussion, and the tool footprint center 316 moves along the circular scan path 318 with a rotational velocity $\dot{\theta}$. Even though the footprint as a whole can be treated as having a net constant velocity in this one circular scan path 318, it will be appreciated that a point, such as a point 320, on a part of the footprint that is radially outwardly of the footprint center 316, is moving with a linear tangential velocity $V_{P1}$, whereas a second part of the footprint, indicated at point 322, which is radially inwardly of the scan footprint center 16, is moving at a different tangential linear velocity $V_{P2}$, where $V_{P1}$ is greater than $V_{P2}$. Stated otherwise, an outer portion of the scan footprint moves at a greater linear tangential velocity than a radially inner portion of the same scan footprint.

Where the radial distance between the scan center 314 and the center of footprint 316 is relatively large, the difference in velocities between $V_{P1}$ and $V_{P2}$ is so small as to be negligible. However, as the radius of the scan path, that is, the radial distance between the center of the footprint 316 and the center 314 of the scan, decreases, the difference in velocities between outer and inner portions of the scan footprint become ever more significant. Results of this difference can be seen in connection with FIG. 10, in which curve 324 represents an inverted showing of a cross section, taken in a plane perpendicular to the direction of tool footprint motion, of the area that is etched out by the plasma assisted chemical etching (PACE) tool in an etching operation. In other words, as the plasma tool head moves across the workpiece in a straight line and at a constant velocity, it will remove portions of the workpiece along a linear groove having a cross section indicated by the area under the symmetrical curve 324, it being understood, as mentioned above, that curve 324 represents an inverted version of the etched out cross sectional area. For the preferred symmetrical (circular) plasma tool head, this etched out area is symmetrical about a vertical center line 326 as the tool and its footprint move in a straight line. However, when the circular tool and its footprint move in a curved or circular path, such as path 318 of FIG. 1, one portion of the tool footprint is moving at a greater linear velocity, $V_{P1}$, than the velocity $V_{P2}$ of a second portion of the tool footprint. Where the velocity of the tool footprint is less, the dwell time of the tool at that particular point within its footprint is increased, and, accordingly, the amount of material etched away at that particular point is increased. The cross sectional area of the etched out portion, indicated by curve 324, is changed by the varying velocities of different parts of the footprint to have an asymmetrical cross section as shown by the dotted line 328 of FIG. 10. Thus the bottom of the etched out area is widened and/or deepened at those portions of the tool footprint which are of lesser velocity as compared to portions of the same tool footprint of greater velocity. This effect and the resulting asymmetry increase as the scan path radius decreases, e.g., as the tool head approaches the scan path center.

Figure 11:
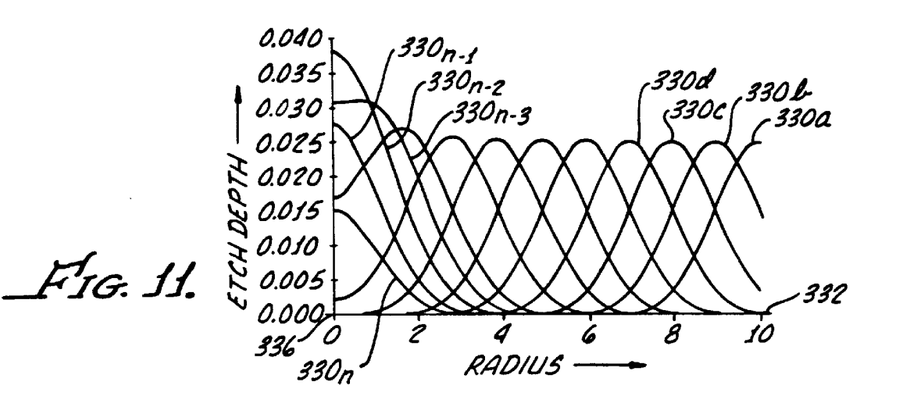
FIG. 11 is a graph showing a plurality of inverted etched area cross sections at a number of different radii in a circular scan.

FIG. 11 indicates a plot of a series of such etched out area cross sections 330a–330n (shown inverted), at different scan path radii, from a tool scan path radius r=10 at point 332, with decreasing radii of each successive curve, as the curve approaches the scan center of zero radius at point 336. Each scan path overlaps the preceding scan path by a major fraction of the plasma head footprint diameter. FIG. 11 illustrates the fact that the cross section of the etched out areas at the larger radii, as indicated by curves 330a, 330b, 330c, etc., are substantially equal and symmetrical, because at the relatively higher scan path radii the velocity differences between inner and outer portions of the scan path are relatively insignificant. However, as the scan path radius decreases and approaches zero, the cross section of the etched out area, as shown by curves 330n-3, 330n-2, 330n-1, and 330n, becomes increasingly asymmetrical. The final curve 330n, having a scan path radius of zero, is not only asymmetrical, but has a portion of greatly increased magnitude. Note that FIG. 11 shows only etched out sections at some, but not all, scan steps.

Figure 12:
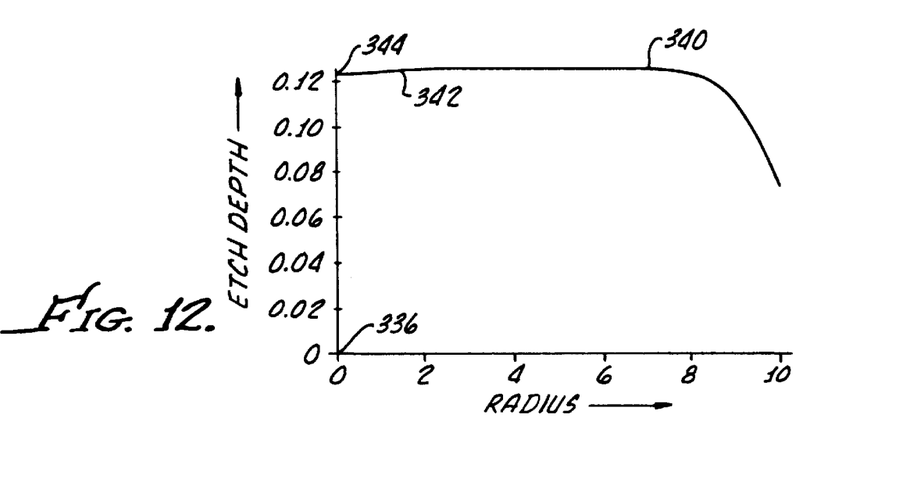
FIG. 12 is a graph showing the sum of etch depth over a circular scan covering a complete circular area of a workpiece.

The depth of each removed area cross section, and all of them including those not shown in FIG. 11 are all added to one another and the curve of the sums is plotted to yield the curve 340, shown in FIG. 12. The curve 440, shows the etch depth over the full radius of the workpiece, due to a complete circular scan. Curve 340 is substantially horizontal for the larger scan path radii and begins to slightly deviate from the horizontal at a point 342 close to the scan center 336. Curve 340 intercepts the ordinate (zero radius) at a point 344 which is below the horizontal major portion of the curve by an amount which indicates the error at this point. It can be shown that if the scanning (and etching) is stopped at a point where the scan path radius is $\Delta r$ (e.g., where $\Delta r$ equals the scan step) as the scan path radius decreases, the error is well within a predetermined acceptable tolerance. If the stepping of radial scanning is caused to occur in sufficiently small increments, each denoted by $\Delta r$, and the several circular scan paths allow the center of the tool footprint to approach the scan center but to stop such approach (and to stop etching) when the tool path center is spaced from the scan path center by $\Delta r$, the error in total etch depth at the center is in within acceptable tolerances. A scan step of not more than about ¼ the radius of the tool head footprint is preferred. For example, where the scan path step $\Delta r$ is ⅛th of the radius $r_t$ (see FIG. 9) of the circular footprint of the tool, the error in etch depth is approximately one in one thousand.

The mathematical basis of these concepts is set forth below.

Derivation of x-y & r-θ Convolution Shaping Integrals- Accuracy of Radial Step/Rotational Scan Implementation of r-θ Convolution for PACE Application- Consequences for Rotational Dwell Control.

Derivation of 2D Convolution Shaping Integral a) For scan x, step y (by $\Delta y$)

Along each x scan:

$$\Delta h_i(x,y) = \int \dot{z}(x - x_o(t), y - y_o^i) dt$$

$$\Delta h_i(x,y) = \int \dot{z}(x - x_o(t), y - y_o^i) dx_o/(dx_o/dt)$$

Summing all the scans:

$$\Delta h(x, y) = \sum_i \Delta h_i(x, y) = \sum_i \int \dot{z}(x - x_o, y - y_o) dx_o/v_o^i(x_o)$$

let $$v_i(x_o) \equiv v_x^i(x_o)/\bar{v}_x$$

$$\bar{v}_x \equiv nL_x/T$$

$$L_y \equiv n\Delta y$$

$$\therefore \bar{v}_x = L_x L_y/\Delta y T$$

then $$\Delta h(x, y) = \sum_i \Delta h_i(x, y) = \sum_i \int \dot{z}(x - x_O, y - y_O^i) T dx_O \Delta y / v_i(x_0) L_x L_y$$

$$\Delta h(x, y) L_x L_y = \sum_i \Delta h_i(x, y) = \sum_i \int \dot{z}(x - x_O, y - y_O^i) \tau_i(x_o) dx_O \Delta y$$

where $$\tau_i(x_o) \equiv T/V_i(x_O)$$

When $\Delta y \to dy$, since $i \Rightarrow y_o, \tau(x_o, y_o) = T/V(x_o, y_o)$, whence $$\Delta h(x,y) L_x L_y = \iint \dot{z}(x - x_o, y - y_o) \tau_i(x_o, y_o) dx_o dy_o$$

b) For scan θ, step in r (by $\Delta r_o$)

At each r with $2\pi$ rotation:

$$\Delta h_i(r, \theta) = \int \dot{z}(r\cos\theta - r_o^i\cos\theta, r\sin\theta - r_o^i\sin\theta_o) dt = \int \dot{z}(1/\omega_i) d\theta_o$$

where $\omega_i = \omega(r_i, \theta)$

Summing all the scans:

$$\Delta h(r, \theta) = \sum_i \Delta h_i(r, \theta) = \sum_i \int \dot{z} d\theta_O/\omega_i$$

let $$\Omega_i(\theta_o) \equiv \omega(\theta_o)/\bar{\omega}$$

$$\bar{\omega} \equiv 2\pi n/T$$

$$R \equiv n\Delta r_o$$

$$\therefore \bar{\omega} = 2\pi R/T\Delta r_o$$

$$\Delta h(r, \theta) = \sum_i \Delta h_i(r, \theta) =$$

$$\sum_i \int \dot{z}(r\cos\theta - r_O^i\cos\theta_o, r\sin\theta - r_O^i\sin\theta_o) Tr_o d\theta_O \Delta r_o/(\Omega_i(\theta_O) 2\pi R^2(r_o/R))$$

$$\Delta h(r, \theta)\pi R^2 = \sum_i \int \dot{z}(r\cos\theta - r_O^i\cos\theta_o, r\sin\theta - r_O^i\sin\theta_o) \tau(\theta_o) r_o d\theta_O \Delta r_o$$

where $$\tau(\theta_O) = T/2\Omega_i(\theta_O) R / r_o^i$$

when $\Delta r_O \to dr_O$ $$\Delta h(r,\theta)\pi R^2 = \iint \dot{Z}(r\cos\theta - r_o\cos\theta_o, r\sin\theta - r_o\sin\theta_o) \tau(r_o, \theta_o) r_o d\theta_o dr_o$$

Constant Dwell (Scan Velocity) with Rotational Motion

We now derive the line integral for a constant radius path with constant velocity, $V_s$, incremented by $\Delta r$ for each revolution of θ by $2\pi$ to evaluate the superposition of the tool removal as the radius is incremented. Given a tool with a removal rate $\dot{z}(x-x_p(t), y-y_p(t))$ at (x,y) with a tool center at $(x_p(t), y_p(t))$, given by $$\Delta h(x, y) = \int \dot{z}(x-x_p(t), y-y_p(t))dt \quad (1)$$

we may transform from x,y to polar coordinates using, $x=r \cos\theta$ and $y=r \sin\theta$, yielding $$\Delta h(r, \theta) = \int \dot{z}(r \cos\theta - r_p \cos\theta_p(t), r \sin\theta - r_p \sin\theta_p(t))dt \quad (2)$$

Choosing a circular path for the tool ($r_p$=const), the above integral may be written with a variable of integration, $O_p$:

$$\Delta h(r,\theta,r_p) = \int \dot{z}(r\cos\theta - r_p\cos\theta_p(t), r\sin\theta - r_p\sin\theta_p(t)) \frac{dt}{d\theta_p} d\theta_p \quad (3)$$

To investigate the artifacts produced in the superposition of these tool removal shapes due to the distortion caused by the scan velocity differences between the inner and outer radii while the tool shape center scans at a constant radius, $r_p$, we choose $d\theta_p/dt = v_s/r_p$, where $V_S$ is the (constant) tangential velocity of the tool center, expected to uniformly remove material if there are no artifacts due to the difference in velocity of inner and outer tool radii, which distorts the removal footprint, and is expected to increasingly distort the footprint as the tool approaches the center.

Choosing a gaussian tool removal rate for simplicity, $\dot{z}=\dot{z}_o \exp(-\rho^2/2\sigma^2)$, where $\rho$ is the distance from the tool center and $\sigma$ is the half amplitude radius of the gaussian. The cosine law, $\rho^2 = r^2 + r_p^2 - 2rr_p \cos(\theta - \theta_p)$, relates the variables in (3) to $\rho$. Substituting these expressions into (3), we obtain:

$$\Delta h(r,\theta,r_p) = \quad (4)$$

$$\dot{z}_0 \frac{r_p}{v_s} \exp(-(r^2 + r_p^2)/2\sigma^2) \int_0^{2\pi} \exp\left(-\frac{rr_p \cos(\theta - \theta_p)}{\sigma^2}\right) d\theta_p$$

with $\theta' = \theta - \theta_p$, (4) becomes:

$$\Delta h(r,r_p) = 2\dot{z}_0 \frac{r_p}{v_s} \exp(-(r^2 + r_p^2)/2\sigma^2) \int_0^{\pi} \exp\left(-\frac{rr_p \cos\theta'}{\sigma^2}\right) d\theta' \quad (5)$$

where the symmetry of the integrand about $\pi$ yields twice the integral over half the range.

This integral can be put into a closed form as given by Gradshteyn and Ryzhik through the following transformation: $\xi = \cos\theta'$; whence $d\theta' = -d\xi/\sqrt{1-\xi^2}$, in the interval $0 \leq \theta \leq \pi$, $1 \geq \xi \geq -1$, transforming (5) to:

finally yielding $$= 4\dot{z}_0 \frac{r_p}{v_s} \exp(-(r^2 + r_p^2)/2\sigma^2) \int_0^1 \cosh\left(\frac{rr_p \xi}{\sigma^2}\right) d\xi/\sqrt{1-\xi^2}$$

but from Gradshteyn and Ryzhik, Eq 3.534.2:

$$\int_0^1 \frac{\cosh \alpha x}{\sqrt{1-x^2}} dx = \frac{\pi}{2} I_0(\alpha)$$

where $I_0(a)$ is a modified Bessel function of the first kind and order zero. The integral is then available in closed form as:

$$\Delta h(r,r_p) = 2\pi \dot{z}_0 \frac{r_p}{v_s} \exp(-(r^2 + r_p^2)/2\sigma^2) I_0\left(\frac{rr_p}{\sigma^2}\right) \quad (6)$$

The superposition of each of the above as $r_p$ steps in radial increments $\Delta r_p$, or $r_p = i \Delta r_p$, yields $$\Delta h(r) = \frac{2\pi \dot{z}_0}{v_s} \sum_{i=1}^n i\Delta r_p \exp(-(r^2 + (i\Delta r_p)^2)/2\sigma^2) I_0\left(\frac{ri\Delta r_p}{\sigma^2}\right) \quad (7)$$

FIGS. 1 and 2 referred to in the above mathematical derivation are the same as FIGS. 11 and 12, respectively, as described above. I. S. Gradshteyn and I. M. Ryzhik, referred to in this derivation, denote the "Table of Integrals, Series and Products", of these authors, prepared by Alan Jeffrey and published by the Academic Press, N.Y., 1980.

Discussion in this mathematical derivation, prepared by the present inventors, shows the error to be within acceptable limits at the center of the rho-theta scan when the scan is (1) stepped only to a scan path radius $r = \Delta r$, and (2) when radial motion of the scan is in sufficiently small increments $\Delta r$.

Further, when tangential velocity $r\dot\theta$ and tangential acceleration $r\ddot\theta$ are both very high compared to radial velocity $\dot{r}$ and radial acceleration $\ddot{r}$ respectively, acceleration induced vibration can be overcome so that control of dwell time is achieved by using only rotation to vary dwell time. Radial velocity is not varied for dwell time control. By employing a very small radial velocity compared to the rotational $$\Delta h(r,r_p) = 2\dot{z}_0 \frac{r_p}{v_s} \exp(-(r^2 + r_p^2)/2\sigma^2) \int_{-1}^1 \exp\left(-\frac{rr_p\xi}{\sigma^2}\right) d\xi/\sqrt{1-\xi^2}$$

$$= 2\dot{z}_0 \frac{r_p}{v_s} \exp\left(-\frac{r^2 + r_p^2}{2\sigma^2}\right) \left\{ \int_{-1}^0 \exp\left(-\frac{rr_p\xi}{\sigma^2}\right) \frac{d\xi}{\sqrt{1-\xi^2}} + \int_0^1 \exp\left(-\frac{rr_p\xi}{\sigma^2}\right) \frac{d\xi}{\sqrt{1-\xi^2}} \right\}$$

letting $\xi' = -\xi$ in the first integral, $$= 2\dot{z}_0 \frac{r_p}{v_s} \exp\left(-\frac{r^2 + r_p^2}{2\sigma^2}\right) \left\{ -\int_1^0 \exp\left(\frac{rr_p\xi'}{\sigma^2}\right) \frac{d\xi'}{\sqrt{1-\xi'^2}} + \int_0^1 \exp\left(-\frac{rr_p\xi}{\sigma^2}\right) \frac{d\xi}{\sqrt{1-\xi^2}} \right\}$$

or $$= 2\dot{z}_0 \frac{r_p}{v_s} \exp\left(-\frac{r^2 + r_p^2}{2\sigma^2}\right) \left\{ \int_0^1 \exp\left(\frac{rr_p\xi'}{\sigma^2}\right) \frac{d\xi'}{\sqrt{1-\xi'^2}} + \int_0^1 \exp\left(-\frac{rr_p\xi}{\sigma^2}\right) \frac{d\xi}{\sqrt{1-\xi^2}} \right\}$$

velocity, the variability of the programmed velocity scan may be based entirely upon varying rotational velocities so that there is no need to control dwell time by variation of radial velocity.

Assuming that the maximum rotation speed $\omega_{mx}=600$ rpm, the linear velocity at the edge of a 125 millimeter diameter wafer of which the surface is to be configured by this system is approximately 3600 millimeters per second at a radius of 62.5 millimeters. This is reduced to 36 millimeters per second at a radius of 0.625 millimeters so that as long as the required velocity map ranges between these speeds (e.g., 3600 millimeters per second and 36 millimeters per second) rotational control of dwell time is possible over the entire substrate. This follows from the relation between the absolute velocity map in X-Y coordinates and that in rho-theta coordinates, where $v^2=V_r^2+r^2\omega^2$. Therefore, to the extent that ($v_r<<r\omega$) the velocity v is approximately $r\omega_{mx}$ and the radial velocity need not be varied to control dwell.

With the ability to scan in circular paths, many advantages and improved types of operations are available in addition to effective elimination of acceleration induced vibration. Overall scanning speed can be much higher because a circular scan may be effectively continuous, as distinguished from X-Y scanning, which must stop at the end of each straight line scan and reverse direction. In fact, the substantially circular scan path may be a continuous spiral with continuous, but still very small, decreasing radius. Since many workpieces are of a circular or near circular configuration, the scanning tool head will scan over an area more commensurate in magnitude and configuration with the area of the workpiece, and need not scan unnecessarily over areas beyond the workpiece. The system can provide scan rates which are orders of magnitude higher than rates available from an X-Y scan system.

Plasma assisted chemical etching or deposition provides many additional improvements, including high pattern transfer fidelity, macroscopic shaping, flattening, thinning and freedom from sub-surface damage, all or some of which will markedly reduce cost and improve electronic products. The described system may be employed for micro-mechanical fabrication of sensors of various configurations, thicknesses, and surface roughness and may be employed for forming many different configurations where precise surface configuration and workpiece thickness are desired. The system can remove as much as 10 cubic millimeters of material per minute and is readily adapted to provide surfaces of varying configurations, including flat surfaces, inclined surfaces, curved surfaces, and aspherical surfaces. For example, the system is readily adapted to configuring the surface of quartz or other optical materials, such as crystalline silicon and aluminum, for shaping spherical, parabolic or other aspherical mirror surfaces. Surface roughness of the resulting micro-etched substrates may be in the order of 10 Å. Both microscopic (below about 1 millimeter or a fraction of a millimeter) and macroscopic (about 1 millimeter or more) configuring and shaping of surfaces can be performed either separately or together. The circular scanning is particularly suited to shaping of optical lenses and mirrors and avoids the mechanical abrading, stress and crack inducing problems of conventional grinding or mechanical polishing.

Because of the high scan velocities available, adverse effects of slower scan rates, such as "piston" are minimized. "Piston" occurs in the macroscopic smoothing of a surface to form a smooth surface substrate from a rough surface piece. Although only a minimum amount of material is desired to be removed, and only from the higher spots, the slow scan speed of the prior at plasma etching head inherently removes relatively large amounts of material from the lowest points on the surface to be smoothed. However, with the greatly increased scan velocities available with the system described herein, only small mounts of material are removed from the lowest points, and thus the overall or average amount of material removed is minimized and the resulting smoothed surface is higher than would be possible with the slower prior art scanning.

Although the described rho-theta scan illustrates an arrangement in which a complete scan starts at a maximum radius from the center of the scan and moves inwardly toward the scan center, it will be readily appreciated that principles of the invention may be employed in many different rho-theta scanning arrangements, including, for example, scanning from the outside and moving inwardly to the point adjacent the scan center point and thereafter reversing the radial direction of the scan motion and moving outwardly in successive circular scans of successively increasing radius, providing a second pass over the workpiece. Furthermore, a scan may be arranged which starts with the tool footprint at a finite distance from the center of the scan and moves outwardly toward the point of maximum radius in successive circles or a continuous spiral and either completes its scan at that point or moves back toward the center with a spiral scan or with circular scans of successively decreasing radius.

Again, although the preferred rho-theta scan shows an arrangement in which the chuck and the substrate carried thereby are rotatable while the plasma head is movable radially, it will be appreciated that the apparatus can be modified so that the plasma chuck revolves in a circular scan about the scan center while the substrate moves only radially. Alternatively, either the plasma head or the substrate may be caused to move both radially and in a circular scan while the other of the two remains still.

The described apparatus has been illustrated in connection with a plasma assisted chemical transport system. Certain principles of the invention as described herein are specifically applicable to other surface shaping apparatus where a tool head does not physically contact the workpiece. Accordingly, it will be readily appreciated that principles of the invention, particularly the rho-theta scanning concepts, may be readily applied to laser machining and electron discharge machining, among other non-contact surface shaping methods.

What is claimed is:

1. A method for shaping the surface of a workpiece comprising the steps of:

providing a tool having a working head that has a working head footprint smaller than the area of said workpiece, mounting said working head for motion relative to said workpiece in proximity to and spaced from the surface of said workpiece, energizing said working head to shape a footprint area of the surface of said workpiece that is immediately proximate to said working head, moving said working head relative to said workpiece surface in substantially circular scan paths having a center at a scan center point on said workpiece, and shifting said scan path radially relative to said scan center point to cause said working head footprint to scan over areas of the surface of said workpiece in a plurality of substantially circular scan paths of different radii each having a center at said scan center point, wherein all said radii have finite values, whereby the center of said working head footprint is spaced from said scan center point in all of said scan paths.

2. The method of claim 1 wherein said shifted scan paths have successively decreasing radii and said working head approaches said scan center point, and including the steps of stopping said moving and said energizing when the center of said working head footprint is at a finite distance from said scan center point.

3. The method of claim 2 wherein said steps of stopping said moving and said energizing are caused to occur after a portion of said working head footprint reaches said scan center point.

4. The method of claim 1 wherein said step of moving comprises relatively moving said working head in circular paths of radii that successively differ by an increment $\Delta r$, and wherein the smallest of said finite values is $\Delta r$.

5. The method of claim 1 wherein said tool comprises a plasma assisted chemical transport tool.

6. The method of claim 4 wherein said smallest finite value is not greater than about one quarter of the radius of said working head footprint.

7. The method of claim 1 wherein said step of shifting said scan path radially imparts a radial velocity to said working head, wherein said step of moving said working head in substantially circular scan path imparts to said working head a rotational velocity that is many times greater than said radial velocity.

8. The method of claim 1 wherein said working head is moved in said scan paths with a rotational velocity that is many times greater than the radial velocity with which said scan path is shifted radially relative to said scan center point.

9. The method of claim 2 wherein the smallest of said finite values is about 1/8th of the radius of said working head footprint.

10. The method of claim 1 wherein said step of moving said working head in substantially circular scan paths comprises the step of rotating said workpiece about said scan center point with a programmed rotational velocity that imparts a tangential velocity to said working head relative to said workpiece, and wherein said step of shifting said scan path radially comprises moving said working head relative to said workpiece with a radial velocity that is many times smaller than said tangential velocity.

11. The method of claim 1 wherein said working head comprises a head that generates a corrosive fluid, said step of shifting said scan path radially comprising employing a linear driving mechanism to move said working head relative to said workpiece, and including the step of positioning an environmental separator between said linear driving mechanism and said working head to block passage of corrosive fluid from said working head to said linear driving mechanism.

12. A method for scanning a tool head over a workpiece to shape the surface of the workpiece without contact, comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$.

13. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said tool head has a tool head area having a tool head radius, and wherein said scan step amount of $\Delta r$ is much smaller than the radius of said tool head radius.

14. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said tool head has an area, and wherein said scan step amount of $\Delta r$ is a small fraction of a major dimension of said area.

15. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said tool head has a circular footprint, and wherein said scan step amount of $\Delta r$ is a small fraction of the radius of said footprint.

16. The method of claim 15 wherein said scan step amount of $\Delta r$ is not more than about one-quarter of the radius of said footprint.

17. The method of claim 16 wherein said scan step amount of $\Delta r$ is not more than about one-eighth of the radius of said footprint.

18. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said tool head has a circular footprint, and wherein said footprint in each scan overlaps the footprint of a preceding scan.

19. The method of claim 18 wherein the footprint of each scan overlaps the footprint of the preceding scan by a major fraction of the diameter of the footprint.

20. The method of claim 19 wherein the scan radius for each succeeding scan decreases by a value $\Delta r$.

21. The method of claim 20 wherein $\Delta r$ is not greater than about one-eighth of the radius of said tool head footprint.

22. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said step of moving said tool head in substantially circular scan paths includes the step of varying the angular velocity of said tool head to thereby introduce acceleration induced rotational vibration, and employing an oppositely rotating torsional body coupled with said tool head for balancing out said rotational vibration.

23. The method of claim 22 including the step of scanning said tool head with an angular velocity that is many times greater than its radial velocity.

24. The method of claim 23 wherein said step of moving said tool head comprises the steps of providing a chuck, securing a workpiece to said chuck, rotating said chuck at a programmed variable rotational velocity, thereby generating acceleration induced rotational vibration, and canceling said rotational vibration by coupling a counter-rotating mass to said chuck.

25. The method of claim 24 wherein said step of moving said tool head includes the step of radially moving said tool head relative to said workpiece with a radial velocity that is many times smaller than said rotational velocity of said chuck.

26. The method of claim 25 wherein each said scan path is a discrete circular path radially displaced from and concentric with adjacent scan paths.

27. The method of claim 25 wherein said scan paths collectively define a continuous spiral path.

28. The method of claim 12 wherein said tool head is a plasma assisted chemical transport tool head.

29. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, disabling said scanning when the radius of any of said scan paths is less than said scan step amount of $\Delta r$, and including the step of causing said tool head to shape the surface of said workpiece by a plasma assisted chemical transport reaction.

30. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said step of moving said tool head comprises moving said tool head over said workpiece at a distance from said workpiece and causing said tool head to shape the surface of said workpiece by a plasma assisted chemical vapor transport reaction.

31. A method for scanning a tool head over a workpiece comprising the steps of:

moving the tool head in scan step amounts of $\Delta r$ over the workpiece in a plurality of mutually adjacent, substantially circular scan paths of successively changing radii, wherein each of said scan paths is substantially centered on a scan path axis, and disabling said scanning when the radius of any of said scan paths is less than said scan step amount of $\Delta r$, wherein said step of moving said tool head comprises the steps of providing a plasma assisted chemical vapor tool head, feeding a reactive gas to said tool head between the tool head and said workpiece, applying a radio frequency voltage across said tool head and workpiece to produce a plasma assisted chemical vapor transport reaction including corrosive gases, employing a mechanical drive mechanism to move said tool head, and positioning a protective curtain between said tool head and said drive mechanism to restrain flow of said reactive gases to said drive mechanism.

32. A tool comprising:

a housing, a reaction chamber in said housing for containing a corrosive fluid, a workpiece support mounted in said chamber, a reaction tool mounted to said housing for movement within said reaction chamber and for generating a corrosive fluid within said chamber, wherein said reaction tool comprises a movable platform movably mounted to said housing, and wherein said environmental separator comprises a flexible curtain circumscribing said reaction tool, said curtain having one part fixed and sealed to said movable platform and another part fixed and sealed to said workpiece support, a drive mechanism mounted to the housing externally of said reaction chamber and connected to said reaction tool to drive said reaction tool within said chamber, and a flexible environment separator connected between said housing and said tool and configured and arranged to block passage of said corrosive fluid to said drive mechanism.

33. The tool of claim 32 wherein said workpiece support is mounted for rotation in said chamber, and including a counter-rotating torsional mass rotatably mounted to said chamber and reactively coupled with said workpiece support.

34. The tool of claim 32 wherein said workpiece support is rotatably mounted to said housing in said chamber, and including a first drive motor for rotating said workpiece support in a first direction about a rotation axis, a torsional body in said housing, a second drive motor connected to rotate said torsional body about said rotation axis in a second direction opposite said first direction, said second drive motor and torsional body being reactively coupled to said first drive motor and rotatable workpiece support to provide mutually balanced equal and opposite rotational torques.

35. The tool of claim 32 wherein said housing comprises a base section and an intermediate section mounted to said base section for movement in a first direction, said reaction tool being mounted to said intermediate section for movement relative to said intermediate section in a second direction perpendicular to said first direction, said environmental separator being connected between said intermediate housing and said platform, said drive mechanism comprising an upper platform mounted for motion relative to said intermediate section in said second direction, said reaction tool being mounted to said upper platform, a second drive mechanism being mounted to said housing for driving said intermediate section in said second direction, and a second environmental separator connected between said intermediate section and said base section, said second environmental separator being interposed between said workpiece support and said second drive mechanism.

36. A plasma assisted chemical transport system comprising:

a housing, a reaction chamber in said housing for containing a reactive fluid, an upper platform slidably mounted to said housing for linear movement in a first direction, a reaction tool in said chamber mounted to said platform for motion therewith, a drive mechanism connected to drive said platform and said reaction tool, a workpiece support rotatably mounted to said housing in said chamber adjacent said reaction tool, a drive motor mounted to said housing and connected to rotate said workpiece support, and a flexible environmental separator circumscribing said reaction tool and connected and sealed to and between said upper platform and said housing, said separator being configured, arranged and positioned to block passage of said reactive fluid to said drive mechanism.

37. The system of claim 36 wherein said workpiece support and drive motor exert first reactive torques on said housing as said workpiece support is rotated in a first direction, and including a torsional counter-balancing system, said counter-balancing system comprising a torsional mass and a second drive motor mounted to said housing and connected to rotate said torsional mass in a direction opposite said first direction, said counter-balancing system being reactively connected to said housing to exert second reactive torques on said housing equal and opposite to said first reactive torques.

38. A plasma assisted vapor transport tool comprising:

a base housing section, an intermediate housing section mounted to said base housing section for linear motion in a first direction relative to said base housing section and having a bottom wall, a first drive mechanism on said base housing section connected to drive said intermediate housing section, an upper platform mounted to said intermediate housing section for linear motion in a second direction orthogonal to said first direction, a second drive mechanism mounted to said intermediate section for driving said upper platform, said base section and part of said intermediate housing section forming a first chamber, said intermediate section and said upper platform forming a second chamber, said intermediate section including a bottom wall having an opening therein, a workpiece support mounted to said base housing section and including a workpiece holding chuck positioned adjacent said opening, a plasma reaction tool mounted to said upper platform within said intermediate housing section and within said second chamber, said tool having a tool head adjacent said chuck for generating plasma, a first flexible environmental separator connected between a lower side of said intermediate section bottom wall and said base section and positioned between said chuck and said first drive mechanism and configured and arranged to block passage of said plasma from said plasma reaction tool to said first drive mechanism, a second flexible environmental separator connected between an upper side of said intermediate section bottom wall and a lower side of said upper platform and positioned between said reaction tool and said second drive mechanism and configured and arranged to block passage of corrosive fluid from said plasma reaction tool to said second drive mechanism.

* * * * *